United States Patent [19]

Srivastava et al.

[11] Patent Number: 5,635,839
[45] Date of Patent: Jun. 3, 1997

[54] HIGH ORDER PASSIVE SHIMMING ASSEMBLY FOR MRI MAGNETS

[75] Inventors: Vishnu C. Srivastava, Highland Heights; Gordon D. DeMeester, Wickliffe, both of Ohio; John V. M. McGinley, London, England

[73] Assignee: Picker International, Inc., Highland Heights, Ohio

[21] Appl. No.: 334,588

[22] Filed: Nov. 4, 1994

[51] Int. Cl.$^6$ .................................................. G01R 33/28
[52] U.S. Cl. .................................... 324/320; 324/318
[58] Field of Search ................................ 324/318, 319, 324/320, 322; 128/653.5; 335/296, 297, 298, 294, 300, 301, 304

[56] References Cited

U.S. PATENT DOCUMENTS

| | | | |
|---|---|---|---|
| 4,587,504 | 5/1986 | Brown et al. | 335/216 |
| 4,698,611 | 10/1987 | Vermilyea | 335/298 |
| 4,733,189 | 3/1988 | Punchard et al. | 324/318 |
| 4,737,716 | 4/1988 | Roemer et al. | 324/319 |
| 4,771,243 | 9/1988 | Vreugdehil et al. | 324/320 |
| 4,853,663 | 8/1989 | Vermilyea | 335/301 |
| 5,003,266 | 3/1991 | Palkovich et al. | 324/320 |
| 5,045,794 | 9/1991 | Dorri et al. | 324/320 |
| 5,168,211 | 12/1992 | Laukien et al. | 324/319 |
| 5,179,338 | 1/1993 | Laskaris et al. | 324/318 |
| 5,235,282 | 8/1993 | Overweg | 324/318 |
| 5,235,284 | 8/1993 | Tahara et al. | 324/320 |
| 5,296,812 | 3/1994 | Kitamura et al. | 324/319 |
| 5,345,208 | 9/1994 | Dorri et al. | 335/301 |
| 5,349,297 | 9/1994 | DeMeester et al. | 324/318 |
| 5,361,054 | 11/1994 | Knuttel | 324/318 |
| 5,400,786 | 3/1995 | Allis | 728/653.5 |

FOREIGN PATENT DOCUMENTS

3923526A1  1/1990  Germany.
2221308    1/1990  United Kingdom.

Primary Examiner—Sandra L. O'Shea
Assistant Examiner—Raymond Y. Mah
Attorney, Agent, or Firm—Fay, Sharpe, Beall, Fagan, Minnich & McKee

[57] ABSTRACT

A subject receiving bore (12) of a magnetic resonance apparatus has an axial length to diameter ratio of less than 1.75:1 and preferably about 1:1. The temporally constant magnetic field generated by superconducting magnets (10) surrounding the bore has various magnetic field harmonic distortions including a Z12 harmonic distortion which is described generally by the equation $Z^{12}$. In long bore magnets with a length to diameter ratio of 2:1 or more, harmonic distortions above Z6 are not present, or if present, not measured. A magnetic field probe (80) measures the magnetic field in the bore at a sufficient number of axial locations to measure at least the Z12 harmonic, e.g., 24 axially displaced locations. The probes are sampled at a sufficient number of angular increments, e.g., 32–36, that any present transverse spherical harmonics are sampled. Ferrous shims (62) are mounted in the bore in the pockets (58) of shim trays (44) to compensate for the Z12 and other sampled harmonics above Z6. The shim trays have a sufficient number of pockets axially along the bore to compensate for the Z12 harmonic, e.g., 24 pockets. Optionally, segmented ferrous rings (92) are mounted in the bore at locations theoretically calculated to minimize higher order harmonic distortion and the shim trays are used to adjust the correction. In the preferred embodiment, the shim trays and the segmented rings are mounted to a cylindrical former (34) that supports a primary gradient coil assembly (32) to position the ferrous material close to the imaging volume.

5 Claims, 4 Drawing Sheets

HIGH ORDER PASSIVE SHIMMING ASSEMBLY FOR MRI MAGNETS

BACKGROUND OF THE INVENTION

The present invention relates to the magnet arts. It finds particular application in conjunction with magnetic resonance imaging apparatus having self-shielded gradient coil assemblies and will be described with particular reference thereto. However, it is to be appreciated that the present invention will also find application in conjunction with magnetic resonance spectroscopy systems and other applications in which a polarizing magnetic field or a magnetic field with a predetermined contour are advantageous.

Magnetic resonance imagers commonly include a bore having a diameter of 60 cm or more for receiving the body of an examined patient. The bore is surrounded by a series of annular superconducting magnets for creating a substantially uniform magnetic field longitudinally through the patient receiving bore. The longer the magnet, the more uniform the primary magnetic field within the patient receiving bore tends to be (uniform over a sphere). Typically, the length of the bore is about twice the diameter.

Such "long" bore magnets are designed such that there is substantially no measurable degradation from harmonics below twelfth order, commonly denoted Z12. The lower order harmonics which occur as a result of construction inaccuracies are typically shimmed by placing pieces of iron in the bore.

A single magnetic field sensor is moved manually to different locations including positions on 12 axial planes. In each plane the detector is rotated in 12 equal angular increments and the magnetic field is measured. In this manner, 12 measurements are made in each of 12 parallel planes on the surface of a spherical volume of interest centered at the isocenter of the magnet.

Shim trays are removably mounted at a number of equiangular locations around the magnetic bore, e.g., 32 to 36. The shim trays each extend the length of the bore and have 12–14 pockets for receiving plates or shims of iron or steel. The shim trays are removed from the bore and the iron or steel shims are mounted in the pockets. The shim trays are replaced and the magnetic field is measured again to assure that the measured harmonics Z1→Z6 have been minimized. Typically, higher order harmonics require significantly more steel to effect a correction than do lower order harmonics.

One of the disadvantages of long bore magnets is that the region of interest is often inaccessible to medical personnel. If a procedure is to be performed based on the image, the patient must be removed from the bore before the procedure can be performed. Moving the patient increases the risk of misregistration problems between the image and the patient. Other disadvantages of the long bore magnets is that they tend to be user-unfriendly and claustrophobic, larger magnets are more expensive than smaller magnets, and the like.

One way to improve access to the patient is to shorten the length of the magnet and the patient receiving bore. If the magnet and the bore were shortened to about 1 meter or roughly the diameter of the patient bore, patient access would be much improved. Although the size of the uniform magnetic field compresses from a sphere toward a more disk-like shape, the area of substantial uniformity is still sufficient for a series of 10–20 contiguous slice images.

However, shortening the bore of the magnet has its difficulties. First, the magnetic field tends to become non-uniform with the presence of higher order harmonics Z10, Z12, and the like. Second, the inventors herein have measured significant higher order harmonic distortions in such short bore magnets. The Z12 harmonic is found to be relatively strong. When monitoring harmonics with 12 probes, the 12 probes fall midway between Z12 harmonics. Because the 12 probes are measuring magnetic fields at the midpoint of the Z12 harmonics, even significant Z12 harmonics disappear. The inventors herein have found that higher order harmonics require more steel which is positioned with higher positional accuracy.

In accordance with the present invention, a magnetic resonance magnet is provided which is shimmed for improved uniformity through at least the Z12 harmonic.

SUMMARY OF THE INVENTION

In accordance with one aspect of the present invention, a short bore magnet having a bore length to bore diameter ratio of less than 1.8:1 is provided. A plurality of shim trays are disposed circumferentially around the bore, in order to shim through at least Z12 harmonics.

In accordance with a more limited aspect of the invention, the shim trays each have at least 24 pockets disposed over the length of the bore.

In accordance with another more limited aspect of the present invention, segmented iron or steel rings are mounted circumferentially around the bore at locations precalculated for minimizing Z12 harmonics. Iron or steel pieces are selectively received in and removable from the shim trays for adjusting the Z12 harmonic shimming.

In accordance with another aspect of the present invention, a large multiplicity of shim trays are disposed around the bore. The multiplicity of shim trays is sufficiently large that the shim trays are substantially side by side. In this manner, when iron or steel sheets are loaded in corresponding pockets of each shim tray, segmented annular shimming rings are defined.

In accordance with another aspect of the present invention, a method of shimming for harmonics above Z6 is provided. Magnetic field strength is sampled along the surface of an imaging volume at an isocenter of the bore. Sampling is conducted in a number of planes which is substantially twice the highest order that shimming is to be used to correct.

In accordance with a more limited aspect of the present invention, probes are positioned to sample the magnetic field in at least 20 planes.

In accordance with another more limited aspect of the present invention, the magnetic field is sampled in 24 planes and each of the shim trays is divided into approximately 24 pockets.

One advantage of the present invention is that it enables magnets to have shorter bores while maintaining uniformity comparable to longer bore magnets.

Another advantage of the present invention is that it promotes patient access while maintaining image quality.

Another advantage of the present invention is that it shims for higher order harmonics than Z6.

Another advantage of the present invention is that it can shim not only for axial gradients, but also for higher order transverse gradients.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
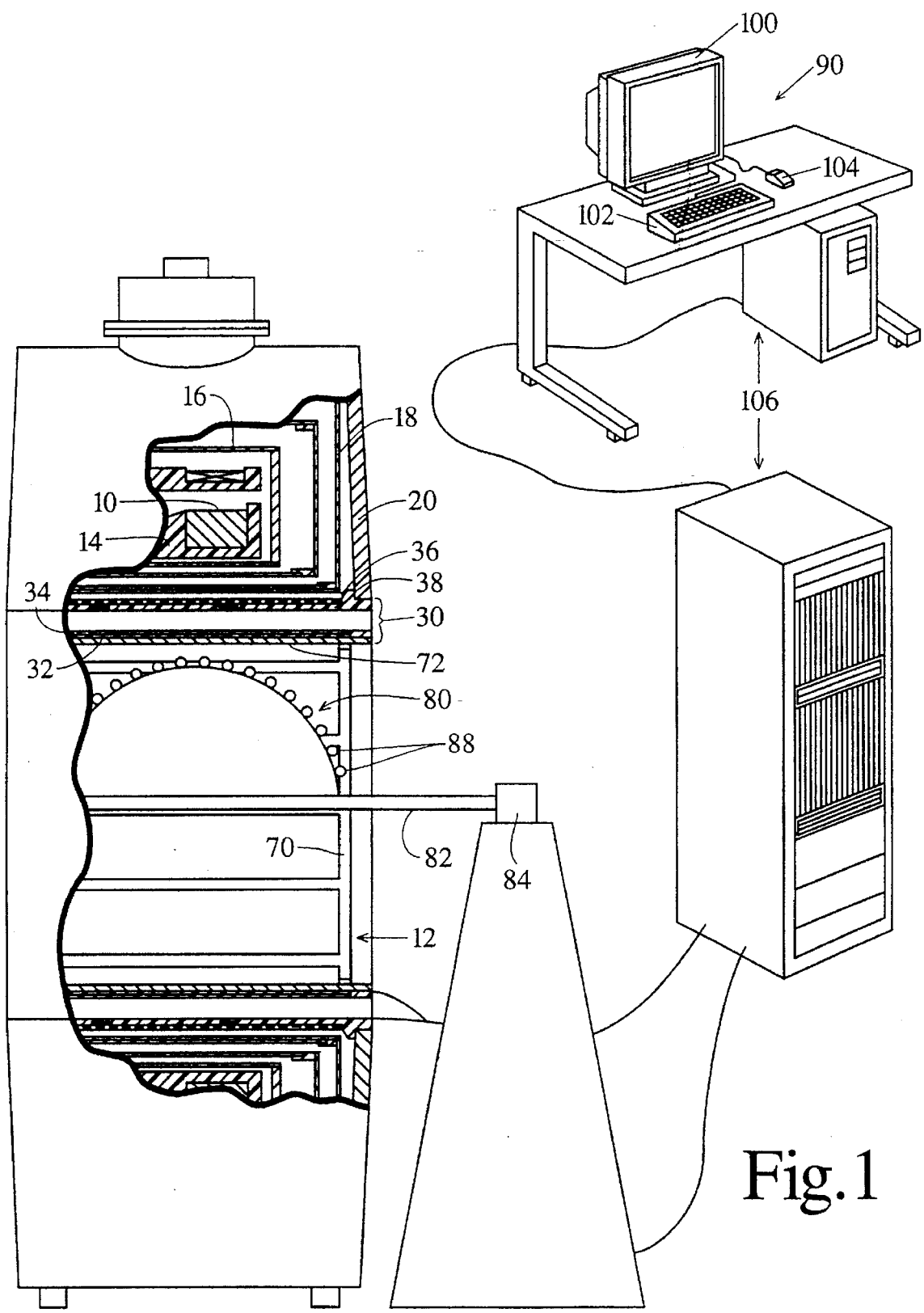
FIG. 1 is a diagrammatic illustration of a magnetic resonance imaging system including a 24 probe magnetic field sensor.
Figure 2:
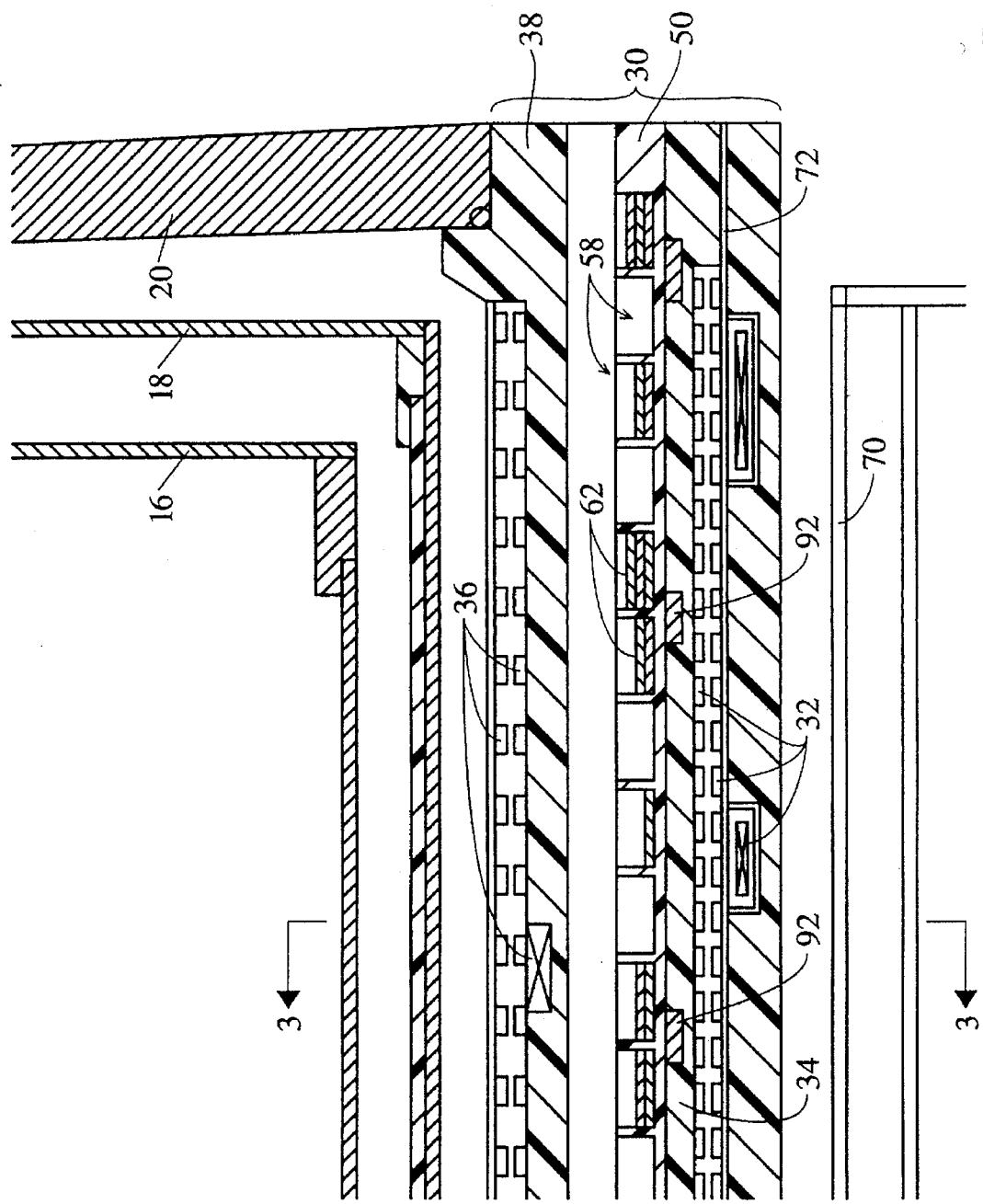
FIG. 2 is a detailed cross-sectional view illustrating a relationship of the shim trays relative to the RF coils and the gradient primary and secondary coils.
Figure 3:
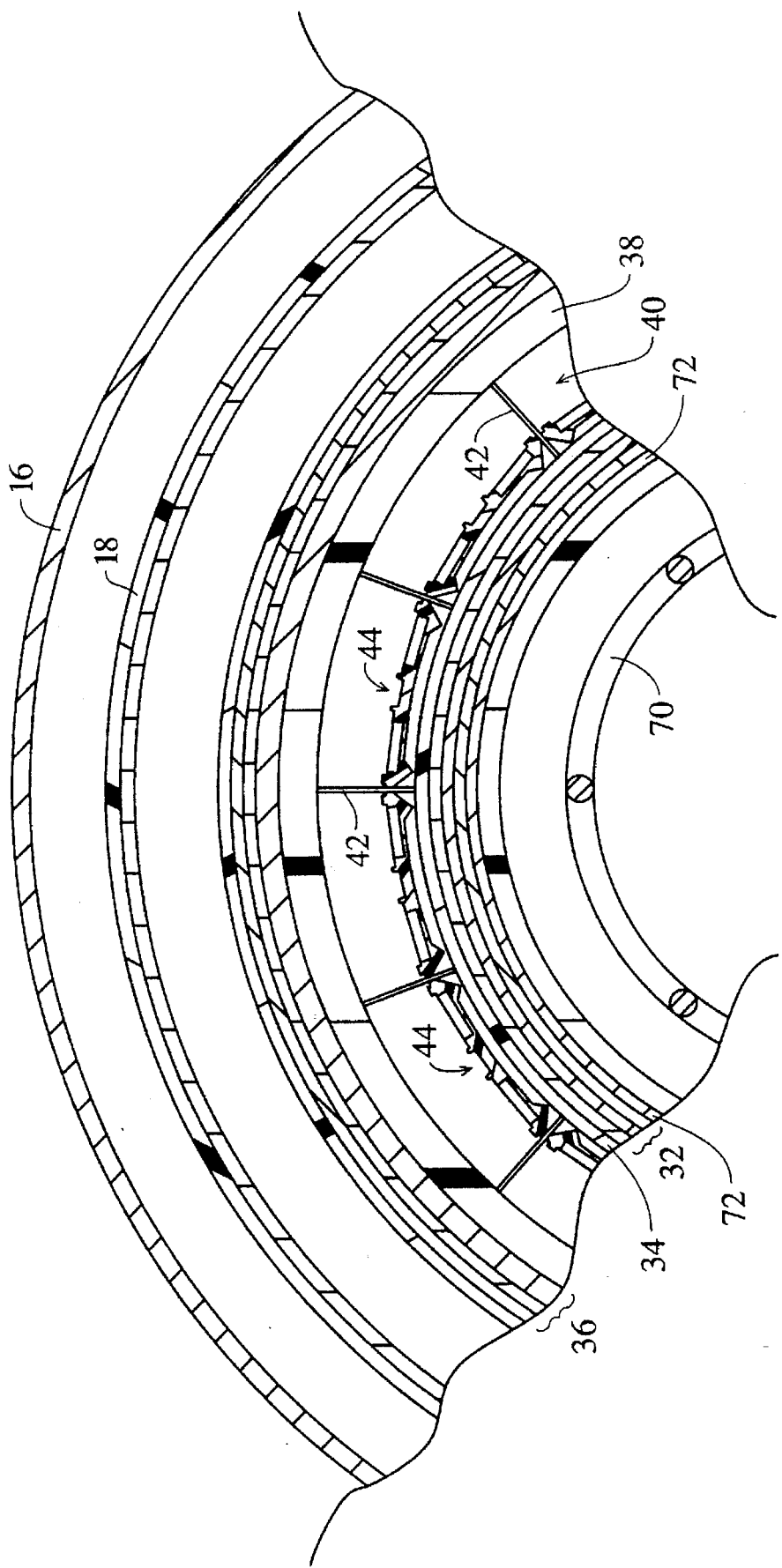
FIG. 3 is a side-sectional view through section 3—3 of FIG. 2.

With reference to FIGS. 1, 2, and 3, a plurality of primary magnet coils 10 generate a temporally constant magnetic field along a longitudinal or z-axis of a central bore 12. The bore has a length to diameter ratio of 1.75:1 or less, preferably 1.67:1. However, still lower ratios such as 1:1 are also contemplated. In a preferred superconducting embodiment, the primary magnetic coils are supported by a former 14 and received in a toroidal helium vessel or can 16. The vessel is filled with liquid helium to maintain the primary magnet coils at superconducting temperatures. The can is surrounded by one or more cold shields 18 which are supported in a vacuum dewar 20.

A whole body gradient coil assembly 30 includes x, y, and z-gradient coils mounted around the bore 12. In the preferred embodiment, the gradient coil assembly is a self-shielded gradient coil assembly that includes primary x, y, and z-gradient coil assemblies 32 potted in a dielectric former 34 and a secondary or shield gradient coil assembly 36 that is supported on a bore defining cylinder 38 of the vacuum dewar 20. The dielectric former 34 with the potted primary gradient coils can function as a bore liner or a cosmetic bore liner can be inserted into it.

The primary and secondary gradient coil assemblies are mounted in a spaced relationship to define an annular shim receiving cavity 40 therebetween. Mechanical supports 42 extend through the shim receiving cavity 40 to support the primary gradient coil assembly. The supports have a minimum width in a circumferential direction to enable a plurality of shim trays 44 to be positioned substantially side by side. In the illustrated embodiment, 36 shim trays are mounted to an outer surface of the primary gradient coil assembly cylindrical former 34.

Figure 4:
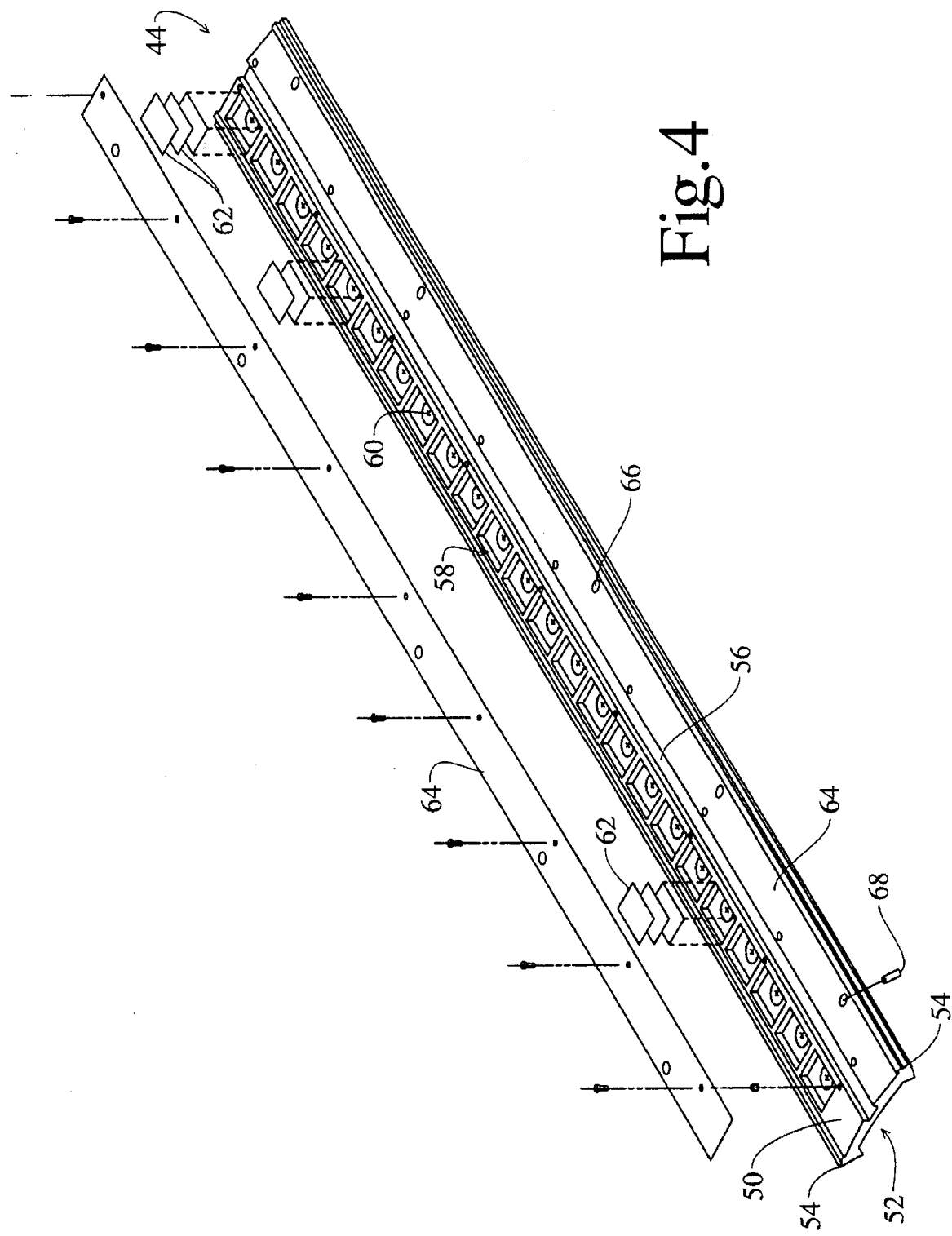
FIG. 4 is a perspective view of one of the shim trays.

With reference to FIG. 4, each of the shim trays 44 in the preferred embodiment includes a dielectric member 50 having a lower surface 52 for accommodating the radius of curvature of the primary gradient coil assembly. Edge surfaces 54 are configured such that the trays are mountable substantially contiguous on the rounded primary gradient coil assembly. The tray defines a central region 56 which carries pocket indicia to provide appropriate labels for the pockets to facilitate identifying each one. To either side of the central indicia, the tray includes 12 pockets 58. Each pocket has an aperture 60 in the base. A multiplicity of thin ferrous shims 62 are provided, which shims are selectively placed in the pockets. The shims may be all of the same magnetic material and thickness such that each provides the same amount of shimming, or shims of different shim strengths, e.g., shims of double or quadruple thickness, may be provided. After the pockets have been filled with the appropriate amounts of shimming material, a dielectric spacer or spring is inserted to hold the shims securely in place. Thereafter, a cover member 64 is fastened over the shims. Apertures or bores 66 for receiving fasteners 68 are provided as selected intervals to facilitate mounting the trays securely to the primary gradient coil.

With reference again to FIGS. 1–3, a radio frequency coil 70 is mounted inside the primary gradient coil. A radio frequency shield 72, e.g., a layer of copper mesh, is mounted between the radio frequency coil and the gradient coil assembly 30.

With particular reference to FIG. 1, a magnetic field sensor probe 80 includes a central shaft 82 which is securely, but removably mountable along a central axis of the bore 12. A means 84 is provided for selectively rotating the shaft, preferably in 10°–12° increments. The shaft carries 24 magnetic field sensor probes 88. The probes are positioned at selected locations to sample a set of spherical harmonics. The half volume is selected such that the probes lie along the surface of an imaging region within which the magnetic field is to be optimized by shimming. A spherical sampling volume is preferred to simplify the use of spherical coordinates for field error plot calculations.

An operator control terminal 90 is connected with the means 84 and the probes 88 to rotate the probe assembly in the selected angular increments and read the output of the probes at each position. The operator station generates magnetic field measures to determine a deviation from uniformity from which the numbers of shims to be placed in each pocket of the shim strips 50 is determined, either iteratively, by operator experience, or by computer program.

With 24 probes, sampling theory suggests that harmonics at least through Z12 can be measured accurately. For a sine wave, two measuring points per cycle facilitate accurate sampling. With only one point per cycle, it can be difficult to differentiate between a sine wave and a straight line. Although 24 probes produce optimal sampling through the Z12, i.e., $Z^{12}$, component, the Z18 component is a sampled rate of 1.5 samples per cycle. The 24 probe sampling system, in fact, produces relatively accurate sampling through Z18. Typical harmonic distortions are as follows:

TABLE 1

| AXIAL TERMS | BEFORE SHIMMING (PPM) | AFTER PASSIVE SHIMMING (PPM) |
|---|---|---|
| Z1 | 187.5 | 1.0 |
| Z2 | 474.9 | 0.7 |
| Z3 | −136.4 | −0.1 |
| Z4 | −25.6 | 1.9 |
| Z5 | 19.5 | 0.3 |
| Z6 | 1.54 | 2.4 |
| Z7 | −2.54 | −1.8 |
| Z8 | −2.8 | 2.6 |
| Z9 | 0.3 | 0.9 |
| Z10 | 1.50 | −6.6 |
| Z11 | 2.6 | 1.1 |
| Z12 | −29.4 | −15.5 |
| Z13 | 1.7 | −0.4 |
| Z14 | 16.9 | 5.8 |
| Z15 | 0.2 | 0.1 |
| Z16 | −5.2 | 0.2 |
| Z17 | 0.2 | 0.2 |
| Z18 | 2.1 | −0.4 |

In a traditional long bore magnet, the axial terms above Z6 would normally be zero or close to zero. However, higher order terms and corrections commonly cause aliasing back into lower order terms. Although it might be noted that with a 12 probe magnetic field sampling system, the sampling density would be too thin to detect higher order harmonics, such as Z12, Z14, and Z16.

Based on the magnetic field variation numbers, the shim trays 44 are loaded and mounted to the exterior of the primary gradient coil assembly 32. The magnetic fields are again sampled analogously to determine how accurately the shimming has corrected the magnetic field harmonic aberrations. Additional shims may be added or subtracted from the shim trays and the procedure repeated iteratively until an acceptable level of magnetic field error is achieved.

The inventors herein have determined that when correcting for Z12, Z14, and Z16 components, the metal shims lie primarily in rings symmetrically about the isocenter of the circle, typically about 3–4 rings on either side of isocenter. Moreover, the inventors herein have found that correcting for Z12, Z14, and to a limited extent for Z16 accounts for about 90% of the steel used for correcting for the Z1–Z14 axial terms.

With reference again to FIG. 2, these annular rings around the bore are at generally the same distance from isocenter for all like-designed magnets. However, each ring requires so much steel that any inaccuracy in the axial positioning of the rings can be detrimental. In an alternate embodiment, shimming is facilitated by placing segmented rings of steel 92 around the primary magnetic field former. In the illustrated embodiment, the primary gradient magnetic coil former 34 is grooved and the grooves contain segments of iron or steel. The segments, such as a plurality of thin plates each covered with an insulating coating, extend around the grooves in one or more layers. In another embodiment, the steel platelets may be placed side to side extending radially and again separated by insulating layers or spacers. Various other segmentations of the ferrous material may be used in order to divide the material into sufficiently small pieces that significant eddy currents are not induced by the application of the radio frequency fields or the gradient magnetic fields.

The segmented rings are installed in the gradient coil assembly during manufacture. Thus, these metal rings are already in place when the initial magnetic field reading is taken. The shimming arrangement in the shim trays is then calculated so as to correct and optimize the first order correction achieved by the segmented metal rings.

Rather than placing the shim trays on the primary gradient coil, the shim trays can also be mounted on the dielectric former 38 of the secondary gradient coil. However, placing the shim trays on the primary gradient coil assembly is preferred because the closer the steel shims are placed to the imaging volume, the stronger their effect. With Z12, Z14, and Z16 gradients which require much higher volumes of steel than Z1 through Z6 axial terms, moving these ferrous materials closer to the imaging volume provides a significant reduction in steel.

The operator interface and control station 90 includes a human-readable display such as a video monitor 100 and an operator input means including a keyboard 102 and a mouse 104. Trackballs, light pens, and other operator input devices are also contemplated. Computer racks 106 hold a magnetic resonance sequence memory and controller, a reconstruction processor, and other computer hardware and software for controlling the radio frequency coil 70 and the gradient coil assembly 30 to implement any of a multiplicity of conventional magnetic resonance imaging sequences, including echo-planar, echo-volume, spin-echo, and others. Echo-planar and echo-volume imaging sequences are characterized by a short data acquisition time and high gradient strengths and slew rates.

The computer racks 106 also hold a digital transmitter for providing radio frequency excitation and resonance manipulation signals to the RF coil and a digital receiver for receiving and demodulating magnetic resonance signals from the radio frequency coil or insertable coils (not shown). An array processor and associated software reconstruct the received magnetic resonance signals into an image representation which is stored in a computer memory, on disk, or other recording media. A video processor selectively extracts portions of the stored reconstructed image representation and formats the data for display on the video monitor 100. An image printer, optionally, provides film copies of selected images.

In the preferred embodiment, the diameter and length of the bore have a size ratio of about 1.67:1. However, it is to be appreciated that the invention is also applicable to magnets with other geometries, particularly magnets with limited magnetic field uniformity. Typically, one might expect magnets with a bore length to diameter ratio of 1.75:1 or less to be candidates for Z12 harmonic correction. However, the present invention will also be applicable to magnetic resonance coils with longer bores in which there is a sufficient magnetic field non-uniformity in the higher order harmonics above Z6.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance apparatus which includes annular main magnets surrounding a subject receiving bore, which bore has a length to diameter ratio of less than 1.75:1, the annular magnets generating a temporally constant magnetic field through the bore, which temporally constant magnetic field has spherical harmonic distortion including a Z12 distortion component, the apparatus further comprising:

a plurality of ferrous rings fixedly disposed around the bore for providing at least partial shimming of the Z12 distortion component; and a multiplicity of ferrous shim receiving pockets disposed longitudinally along the bore, circumferentially around the bore, and radially outward from the ferrous rings for further shimming the Z12 distortion component and for shimming distortion components lower than Z12.

2. A magnetic resonance imaging apparatus comprising:

a bore for receiving a subject to be imaged, the bore having a diameter and an axial length;

an annular magnet surrounding the bore to generate a temporally constant magnetic field axially through the bore, the temporally constant magnetic field having non-uniformity components;

a radio frequency coil disposed around the bore and positioned to broadcast cast radio frequency signals into the bore and receive radio frequency signals from the bore;

a self-shielded gradient coil assembly disposed between the radio frequency coil and the bore, the self-shielded gradient coil assembly including a primary gradient coil assembly having a smaller diameter and disposed adjacent the radio frequency coil and a secondary gradient coil assemblies defining a shim tray receiving annular region therebetween;

a plurality of segmented rings of ferrous material extending circumferentially around the examination region adjacent the primary gradient coil assembly for shimming the magnetic field;

at least 32 shim trays disposed circumferentially around the primary gradient coil assembly in the shim tray receiving region and mounted to the primary gradient coil assembly, each of the shim trays including at least 20 of the shim receiving pockets, the shims held in the shim trays adjusting the magnetic field shimming performed by the segmented rings.

3. A method of shimming a magnetic resonance apparatus which includes a bore having a diameter and an axial length, an annular magnet surrounding the bore to generate a temporally constant magnetic field axially through the bore, a radio frequency coil disposed to broadcast radio frequency signals into the bore and receive radio frequency signals from the bore, the method comprising:

(a) measuring magnetic field uniformity including measuring for harmonic distortion components from Z6 at least through Z12;

(b) placing ferrous shim members in annular rings within and around the bore to make an initial coarse compensation at least for the measured Z12 harmonic distortion component;

(c) measuring the magnetic field at least at 20 axial positions along a surface of an imaging volume and at a plurality of rotationally displaced positions around the imaging volume;

(d) mounting ferrous plates selectively in an array of shim receiving pockets of shim trays which are disposed axially along and circumferentially around the bore in accordance with the measurement of step (c) to refine the compensation for the Z12 harmonic distortion component and for other harmonic distortion components;

(e) selectively repeating steps (c) and (d) until harmonic distortion is minimized.

4. The magnetic resonance apparatus of claim 1 wherein the multiplicity of shim receiving pockets include at least 20 pockets which are disposed along the bore such that shims disposed in the pockets can emulated up to 20 annular rings.

5. The magnetic resonance apparatus as set forth in claim 1 further comprising:

a self-shielded gradient coil including a primary gradient coil mounted on a smaller diameter cylinder and a larger diameter shield gradient coil, the smaller diameter primary gradient coil and the larger diameter shield gradient coil defining an annular shim tray receiving aperture therebetween;

a plurality of shim trays which define the ferrous shim receiving pockets mounted to the primary gradient coil in the annular shim tray receiving aperture.

* * * * *